US006774298B2

United States Patent
Tauchi et al.

(10) Patent No.: US 6,774,298 B2
(45) Date of Patent: Aug. 10, 2004

(54) THERMOELECTRIC MODULE AND METHOD OF PRODUCING THE SAME

(75) Inventors: Hitoshi Tauchi, Anjo (JP); Masato Itakura, Toyota (JP); Hirotsugu Sugiura, Hekinan (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 232 days.

(21) Appl. No.: 10/059,392

(22) Filed: Jan. 31, 2002

(65) Prior Publication Data

US 2002/0149896 A1 Oct. 17, 2002

(30) Foreign Application Priority Data

Jan. 31, 2001 (JP) ........................................ 2001-022565

(51) Int. Cl.[7] .................... H01L 35/34; H01L 35/28; H01L 35/08; H01L 35/14; F25B 21/02
(52) U.S. Cl. ..................... 136/201; 136/203; 136/237; 136/239; 136/240; 136/241; 62/3.3; 257/930
(58) Field of Search ....................... 136/203, 205, 136/230, 237, 236.1, 239, 240, 241, 242; 62/3.3; 257/930

(56) References Cited

U.S. PATENT DOCUMENTS 5,429,680 A * 7/1995 Fuschetti .................... 136/203
5,610,366 A * 3/1997 Fleurial et al. ............. 136/202

FOREIGN PATENT DOCUMENTS

JP 10-62659 3/1998

OTHER PUBLICATIONS

Merriam Webster's Collegiate Dictionary, tenth edition, 1996, Merriam Webster, Inc.*
A–Z of Thermoelectric Conversion, 1995, pp 24–25, Realize Company).

* cited by examiner

Primary Examiner—Patrick Ryan
Assistant Examiner—Thomas H. Parsons
(74) Attorney, Agent, or Firm—Oblon, Spivak, McClelland, Maier & Neustadt, P.C.

(57) ABSTRACT

A thermoelectric module which includes case 1, heat-radiation side insulating substrate 4a, heat-absorption side insulating substrate 4b, first soldering layer 5a formed of a first soldering agent to connect the heat-radiation side insulating substrate 4a and the case 1, a plurality of P-type and N-type semiconductor chips interposed between the heat-radiation side insulating substrate 4a and the heat-absorption side insulating substrate 4b, the plurality of P-type and N-type semiconductor chips being arranged alternately, and a second soldering layer 15a (15b) formed of a second soldering agent to connect the heat-radiation side insulating substrate 4a and one end of each of the plural P-type and N-type semiconductor chips (the heat-absorption side insulating substrate 4b and the other end of each of the plural P-type and N-type semiconductor chips), the first soldering agent and the second soldering agent being identical in raw material.

4 Claims, 1 Drawing Sheet

THERMOELECTRIC MODULE AND METHOD OF PRODUCING THE SAME

The present application is based on and claims priority under 35 U.S.C. §119 with respect to Japanese Patent Application No.2001-022565 filed on Jan. 31, 2001 (13th Year of Heisei), the entire content of which is incorporated herein by reference.

BACKGROUND OF THE INVENTION

1. Field of the Invention

The present invention is generally directed to a thermoelectric module and method of producing the same, the thermoelectric module being in the form of, e.g., a semiconductor laser module for optical communication, a semiconductor amplifier module, an external modulator module or a receiving module.

2. Discussion of the Background Art

In general, the temperature of an installation environment of such a module or the external atmospheric temperature of a case in which such a module is installed reaches 60–70 degrees Centigrade due to the Joule heat of its electric components. Due to the fact that the laser diode which is widely used in a laser module as a light source in high-speed optical fiber communication changes its optical characteristics such as wavelength with changes in atmospheric temperature, the chip carrier which mounts the laser diode thereon is kept in thermal isolation from the case. In order to ensure such thermal isolation and to make the temperature of the laser diode constant, a thermoelectric module (i.e., temperature controlled thermoelectric module) has been used or employed.

This thermoelectric module is produced by soldering an electrode provided insulating material and a semiconductor chip, to connect the two. As Japanese Patent Laid-open Print No.Hei. 10 (1998)-62659 discloses, a soldered connection is provided at heat-absorption and heat-radiation sides of the insulating material, in general.

For example, for cooling, the soldered assembly of the thermoelectric module is soldered to an object to be cooled down or a structure to be heat-radiated such as a heat sink or box, using a soldering agent. This soldering agent is lower in melting point (solidus/liquidus), than a soldering agent which is used in the module assembly for the connection of semiconductor tip). This is done to prevent the thermoelectric module from being deformed or broken upon soldering connection. Selection of the soldering agent is determined in consideration of a safe rate of temperature overshoot upon heating, relative to the melting point of the tip connecting soldering agent.

When the thermoelectric module is required to be heat-resistant in-use, as in "A-Z of Thermoelectric Conversion" (1995, pp. 24–25, Realize Company), 95Sn5Sb soldering agent is used for the connection of the semiconductor tip in general, due to heat-resistance limitations of the semiconductor tip as well as the soldering agent, per se, respectively.

However, using the above-mentioned soldering agent which is lower in melting point (solidus/liquidus) than the soldering agent which is used in the module assembly for the connection of the semiconductor tip can lower the connection reliability at the connection of the structure to be heat-radiated when the module is required to be used in a severe thermal environment.

In addition, if 95Sn5Sb soldering agent is employed as the soldering agent which is used in the module assembly for the connection of semiconductor tip, making the other soldering agent as high as possible in heat resistance results in including Pb, which is environmentally unacceptable.

Thus, a need exists to provide a thermoelectric module which is free from the aforementioned drawbacks.

SUMMARY OF THE INVENTION

Accordingly in order to meet the above need to overcome the aforementioned drawbacks or problems, a first aspect of the present invention provides a thermoelectric module which includes a case, a heat-radiation side insulating substrate, a heat-absorption side insulating substrate, a first soldering layer formed of a first soldering agent at a position to connect the heat-radiation side insulating substrate and the case, a plurality of P-type and N-type semiconductor chips interposed between the heat-radiation side insulating substrate and the heat-absorption side insulating substrate, the plurality of P-type and N-type semiconductor chips being arranged alternately to be connected in a series, and a second soldering layer formed of a second soldering agent at a position to connect the heat-radiation side insulating substrate and one end of each of the plural P-type and N-type semiconductor chips, the second soldering layer connecting the heat-absorption side insulating substrate and the other end of each of the plural P-type and N-type semiconductor chips, the second soldering agent being identical with the first soldering agent in raw material.

In accordance with the first aspect of the present invention, even if 95Sn5Sb is employed as the second soldering agent for the connection of the semiconductors, forming the thermoelectric module can be made possible without lowering heat-resistance at the heat-radiation side. In addition, no other soldering agents make it possible to produce the thermoelectric module at a lower cost.

A second aspect of the present invention provides a method of producing a thermoelectric module which includes the steps of a first process for connecting a case and a heat-radiation side insulating substrate with a first soldering agent to form a first soldering layer between the case and the heat-radiation side insulating substrate; and a second process for connecting a heat-radiation side insulating substrate and a heat-absorption side insulating substrate to one end and the other end, respectively, of each of a plurality of P-type and N-type semiconductor chips with a second soldering agent which is identical with the first soldering agent in raw material.

In accordance with the second aspect of the present invention, during soldering, the thermoelectric module is made free from thermal deformation or breakage. In addition, no other soldering agents make it possible to produce the thermoelectric module at a lower cost.

A third aspect of the present invention provides a thermoelectric module wherein the first soldering agent and the second are selected at least from 95Sn5 Sb, 91Sn9Zn, 96.5Sn3.5Ag, 97.5Sn2.5Ag, 100Sn, 65Sn25Ag10Sb, 99Sn1Sb, 90In10Ag, 97Sn3Sb, 95Sn5Ag, 93Sn7Sb, 80Au20Sn, 90Sn10Ag, and 97Sn3Cu.

In accordance with the third aspect of the present invention, forming the thermoelectric module can be done without lowering heat-resistance at the heat-radiation side. In addition, no Pb is contained in either soldering agent, which is environmentally desirable.

A fourth aspect of the present invention is to provide a method of producing a thermoelectric module wherein the first soldering agent and the second soldering are selected at least from 95Sn5Sb, 91Sn9Zn, 96.5Sn3.5Ag, 97.5Sn2.5Ag, 100Sn, 65Sn25Ag10Sb, 99Sn1Sb, 90Sn10Ag, 97Sn3Sb, 95Sn5Ag, 93Sn7Sb, 80Au20Sn, 90Sn10Ag and 97Sn3Cu.

In accordance with the fourth aspect of the present invention, during soldering, the thermoelectric module is made free from thermal deformation or breakage.

BRIEF DESCRIPTION OF THE DRAWINGS

The above and other objects, features and advantages of the present invention will be more apparent and more readily appreciated from the following detailed description of preferred exemplary embodiments of the present invention, taken in connection with the accompanying drawings, in which.

DETAILED DESCRIPTION OF THE PRESENT INVENTION

Hereinafter, embodiments of the present invention will be described in detail with reference to the attached drawings.

Figure 1:
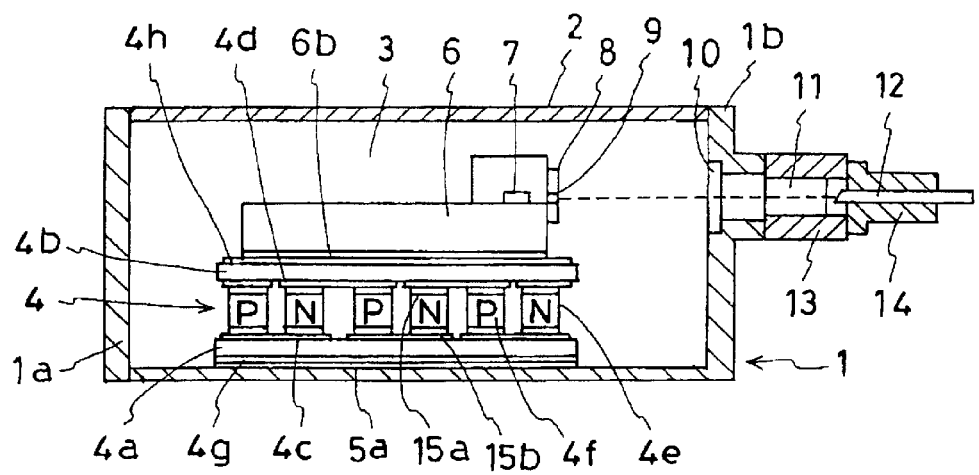
FIG. 1 is a cross-sectional view of an embodiment of a thermoelectric module in accordance with the present invention.

Referring first to FIG. 1, there is illustrated a semiconductor laser module in accordance with an embodiment of the present invention. The semiconductor laser module includes a sealed or fluid-tight package 3 which is constituted by a box-shaped case 1 and a cover 2 covering the case 1. An amount of dried nitrogen gas is filled in the sealed package 3. On an inside surface of a bottom wall 1a of the case 1, there is soldered by a first soldering layer (i.e., a soldering layer between the case and heat-radiation side insulating substrate) 5a, via a second lower electrode 4g, an insulating substrate (i.e. heat-radiation side insulating substrate) 4a of a Peliter element type thermoelectric module 4 for controlling the thermoelectric module 4.

In the thermoelectric module 4, the heat-radiation side insulating substrate 4a is opposite to a heat-absorption side insulating substrate 4b to constitute a pair. On an upper surface of the heat-radiation side insulating substrate 4a and a lower surface of the heat-absorption side insulating substrate 4b, there are formed first lower electrodes 4c and second upper electrodes 4d, respectively. As a raw material of the heat-radiation side insulating substrate 4a and the heat-absorption side insulating substrate 4b, $Al_2O_3$ or AlN is selected. The first lower electrodes 4c and the second upper electrodes 4d connect a plurality of N-type and P-type semiconductor tips in series such that the N-type and P-type semiconductor chips are alternately arranged: N-P-N-P - - -. One of the first lower electrodes 4c to which one of the N-type semiconductor chips is connected which is located at an outermost position is connected with a lead wire, while one of the second upper electrodes 4d to which one of the P-type semiconductor chips is connected which is located at another outermost position is connected with another lead wire.

In addition, on the upper surfaces of the heat-absorption side insulating substrates 4b, a second upper electrode 4d is provided or formed.

The upper surface of the thermoelectric module 4 is adhered with a chip carrier 6 via a third soldering layer (a soldering layer between the chip carrier and the heat-absorption side insulating substrate) 6b. On the chip carrier 6, there is mounted a laser diode 7 near which is a lens holder 8 which holds a spherical lens 9. At a right wall 1b of the case 1, there are provided a glass plate 10, a rod lens 11 which is held by a holder 13, and an optical fiber 12 which is held by a holder 14. It is to be noted that an outer bottom of the case 1 may be provided with radiator fins (not shown).

In this semiconductor laser module, the case 1 is formed of a fernico family alloy which has a small thermal expansion rate relative to the glass plate 10 and each of the ceramic substrates 4a and 4b. As examples of such as an alloy, an alloy comprising 54 weight % Fe, 29 weight % Ni, and 17% Go, and an alloy comprising 58 weight % Fe and 42% Ni. The thermoelectric module 4 is adhered to a bottom inside surface of the case 1 via the soldering agent layer 5a, as previously described.

A heat-absorption side second soldering layer 15a is provided between an upper end of the N-type semiconductor chip 4e (an upper end of the P-type semiconductor chip 4f) and the heat-absorption side insulating electrode 4d, while a heat-radiation side second soldering layer 15b is provided between a lower end of the N-type semiconductor chip 4e (a lower end of the P-type semiconductor chip 4f) and the heat-radiation side insulating electrode 4c.

In summary, the case 1 and heat-radiation side insulating substrate 4a are soldered to each other by way of the first soldering layer 5a formed of a first soldering agent. The upper end of the P-type (N-type) semiconductor chip and the heat-absorption side insulating substrate 4b are soldered to each other by way of the heat-absorption side soldering layer 15a which is formed of a second soldering agent of 95Sn5Sb (melting point: 232° Centigrade/Liquidus). The lower end of the P-type (N-type) semiconductor chip and the heat-radiation side insulating substrate 4a are soldered to each other by way of the heat-radiation side soldering layer 15b. The first soldering agent and the second soldering agent are identical in raw material.

Figure 2:
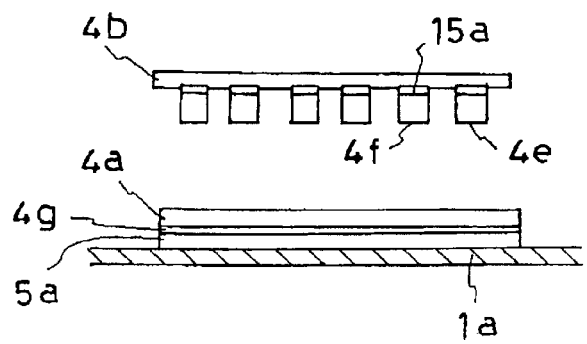
FIG. 2 is an illustration showing a first embodiment of a method of producing the thermoelectric module shown in FIG. 1.
Figure 3:
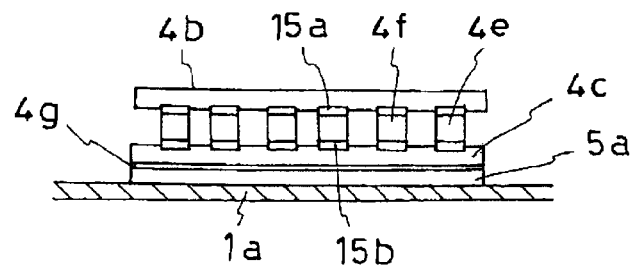
FIG. 3 is an illustration showing a second embodiment of the method of producing the thermoelectric module shown in FIG. 1.

Next, with reference to FIGS. 2 and 3, an explanation is made in detail as to how the aforementioned thermoelectric module 4 is made. As shown in FIG. 2, the first soldering agent of 95Sn5Sb (melting point: 232° Centigrade/Solidus) is used to connect the bottom wall 1a of the case 1 and the heat-radiation side insulating substrate 4a at an ambient temperature of 280° centigrade. Thus, the first soldering layer 5a is provided between the bottom wall 1a of the case 1 and the heat-radiation side insulating substrate 4a.

Next, the second soldering agent of 95Sn5Sb (melting point: 232° Centigrade/Solidus) is used to connect the heat-absorption side insulating substrate 4b and the upper end of each of P-type and N-type semiconductor chips 4e and 4f at an ambient temperature of 280° Centigrade. Thus, the heat-absorption side second soldering layer 15a is provided between the heat-absorption side insulating substrate 4b and the upper end of each of P-type and N-type semiconductor chips 4e and 4f.

Then, as shown in FIG. 3, the heat-absorption side insulating substrate 4b from which the P-type and N-type semiconductor chips 4e and 4f depend is lowered so as to solder the lower end of each of the P-type and N-type semiconductor chips 4e and 4f and the heat-radiation side insulating substrate 4a such that the heat-radiation side soldering layer 15b is provided therebetween.

As mentioned above, the first soldering agent and the second soldering agent are identical in raw material, of course, resulting in that the melting point of the first soldering agent which constitutes the first soldering layer 5a and the melting point of the second soldering agent which constitutes the second soldering layers 15a and 15b are identical.

As the raw material of the soldering layer 6b, 58Bi42Sn solder agent is employed. The above-described thermoelectric module is made free from Pb entirely.

A heat resistance experiment was conducted with respect to the thermoelectric module such that currents were supplied thereto to read temperatures at the heat-radiation side insulating substrate as shown in Table 2. The evaluation results are set such that if the soldering agents are found to be melted (not to be melted) at each of the chip connecting portion and the heat-radiation side insulating connecting portion OK, i.e., Pass (NG, i.e., Fail) is marked.

Though in the foregoing disclosure as the raw material of the first and the second soldering agents 95Sn5Sb is used, others are available such as 91Sn9Zn, 96.5Sn3.5Ag, 97.5Sn2.5Ag, 100Sn, 65Sn25Ag10Sb, 99Sn1Sb, 90In10Ag, 97Sn3Sb, 95Sn5Ag, 93Sn7Sb, 80Au20Sn, 90Sn10Ag and 97Sn3Cu, as listed in Table 1 in the next page.

TABLE 1

| Raw Material | Liquidus (C) | Solidus (C) | Notes |
| --- | --- | --- | --- |
| 95Sn5Sb | 240 | 232 | |
| 91Sn9Zn | 199 | | Eutectic point |
| 96.5Sn3.5Ag | 221 | | Eutectic point |
| 97.5Sn2.5Ag | 226 | 221 | |
| 100Sn | 232 | | Melting point |
| 65Sn25Ag10Sb | 233 | | Melting point |
| 99Sn1Sb | 235 | | |
| 90In10Ag | 237 | 141 | |
| 97Sn3Sb | 238 | 232 | |
| 95Sn5Ag | 240 | 221 | |
| 93Sn7Sb | 244 | 235 | |
| 80Au20Sn | 280 | | Eutectic point |
| 90Sn10Ag | 295 | 221 | |
| 97Sn3Cu | 300 | 227 | |

A comparative example was prepared which is identical with the above embodiment except that a raw material of the soldering agent 37Pb63Sn was employed. Like the embodiment, this device was heat tested for evaluation. The results are shown in Table 2.

TABLE 2

| | | | |
| --- | --- | --- | --- |
| Heat-radiation Side Insulating Substrate Temperature | 100° C. | 100° C. | 100° C. |
| Embodiment: | | | |
| Chip connecting portion | ○ | ○ | ○ |
| Heat-radiation Side Insulating Substrate Connecting Portion | ○ | ○ | ○ |
| Comparative Example: | | | |
| Chip connecting portion | ○ | ○ | ○ |
| Heat-radiation Side Insulating Substrate Connecting Portion | ○ | ○ | |

○: PASS, : FALSE

As Table 2 reveals, in the comparative example the soldering agent melts between the heat-radiation side insulating substrate and the case when the temperature of the heat-radiation side insulating substrate reaches 200° C. due to, i.e., the limited selection of soldering agent in light of the aforementioned safe rate in production process. To the contrary, in the embodiment, the soldering agent 95Sn5Sb employed at both connecting portions has characteristic values (solidus line: 240° C./liquidus line: 232° C.), which allows the thermoelectric module to have a greater heat resistance of not less than 200° C. The thermoelectric module can also be made free from Pb which is eco-friendly.

The invention has thus been shown and description with reference to specific embodiments, however, it should be understood that the invention is in no way limited to the details of the illustrates a structures but changes and modifications may be made without departing from the scope of the appended claims.

What is claimed is:

1. A thermoelectric module comprising:

a case;

a heat-radiation side insulating substrate;

a heat-absorption side insulating substrate;

a first soldering layer formed of a first soldering agent at a position to connect the heat-radiation side insulating substrate and the case;

a plurality of P-type and N-type semiconductor chips interposed between the heat-radiation side insulating substrate and the heat-absorption side insulating substrate, the plurality of P-type and N-type semiconductor chips being arranged alternately to be connected in a series; and a second soldering layer formed of a second soldering agent at a position to connect the heat-radiation side insulating substrate and one end of each of the plural P-type and N-type semiconductor chips, the second soldering layer also connecting the heat-absorption side insulating substrate and the other end of each of the plural P-type and N-type semiconductor chips, the second soldering agent being identical with the first soldering agent in raw material.

2. A thermoelectric module as set forth in claim 1, wherein the first soldering agent and the second soldering agent are selected from the group consisting of 95Sn5Sb, 91Sn9Zn, 96.5Sn3.5Ag, 97.5Sn2.5Ag, 100Sn, 65Sn25Ag10Sb, 99Sn1Sb, 90In10Ag, 97Sn3Sb, 95Sn5Ag, 93Sn7Sb, 80Au20Sn, 90Sn10Ag, and 97Sn3Cu.

3. A method of producing a thermoelectric module comprising the steps of:

connecting a case and a heat-radiation side insulating substrate with a first soldering agent to form a first soldering layer between the case and the heat-radiation side insulating substrate; and connecting the heat-radiation side insulating substrate and a heat-absorption side insulating substrate to one end and the other end, respectively, of each of a plurality of P-type and N-type semiconductor chips, with a second soldering agent which is identical with the first soldering agent in raw material.

4. A method of producing a thermoelectric module as set forth in claim 3, wherein the first soldering agent and the second soldering agent are selected from the group consisting of 95Sn5Sb, 91Sn9Zn, 96.5Sn3.5Ag, 97.5Sn2.5Ag, 100Sn, 65Sn25Ag10Sb, 99Sn1Sb, 90In10Ag, 97Sn3Sb, 95Sn5Ag, 93Sn7Sb, 80Au20Sn, 90Sn10Ag, and 97Sn3Cu.

* * * * *